(12) United States Patent
Zhang et al.

(10) Patent No.: US 9,106,089 B2
(45) Date of Patent: Aug. 11, 2015

(54) SELF-ADAPTING VOLTAGE AMPLIFIER AND BATTERY CHARGER DETECTION

(71) Applicants: Wenzhong Zhang, Tianjin (CN); Shayan Zhang, Tianjin (CN); Yi Zhao, Tianjin (CN)

(72) Inventors: Wenzhong Zhang, Tianjin (CN); Shayan Zhang, Tianjin (CN); Yi Zhao, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 246 days.

(21) Appl. No.: 13/958,600

(22) Filed: Aug. 4, 2013

(65) Prior Publication Data

US 2014/0217960 A1  Aug. 7, 2014

(30) Foreign Application Priority Data

Feb. 5, 2013  (CN) .......................... 2013 1 0044701

(51) Int. Cl.
*H02J 7/00* (2006.01)
*H03F 3/45* (2006.01)

(52) U.S. Cl.
CPC .......... *H02J 7/0052* (2013.01); *H03F 3/45183* (2013.01); *H02J 2007/0062* (2013.01)

(58) Field of Classification Search
USPC ................... 320/107, 108, 109; 330/127, 196
See application file for complete search history.

(56) References Cited

U.S. PATENT DOCUMENTS

| 6,292,050 | B1 * | 9/2001 | Dooley et al. ................. 327/540 |
| 6,969,982 | B1 | 11/2005 | Caldwell |
| 7,501,891 | B2 | 3/2009 | Yamaguchi |
| 2005/0218991 | A1 * | 10/2005 | Birbeck ........................ 330/296 |
| 2008/0272839 | A1 | 11/2008 | Huang |
| 2012/0313701 | A1 * | 12/2012 | Khlat et al. ................... 330/127 |

OTHER PUBLICATIONS

USB Implementers Forum, Inc., Battery Charging Specification v1.2, Dec. 7, 2010. (http://www.usb.org/developers/devclass_docs/BCv1.2_011912.zip).

* cited by examiner

*Primary Examiner* — Brian Ngo
(74) *Attorney, Agent, or Firm* — Charles Bergere; Shayan Zhang

(57) ABSTRACT

An amplifier applies a self-adapting voltage to an output terminal. A bias circuit provides a greater bias current in a first external connection condition, in the absence of a pull-up resistance connected to the output terminal, than when such a pull-up resistance is present. The amplifier applies a different voltage to the output terminal in the absence of a pull-up resistance than when such a pull-up resistance is present. The circuit can be used in a portable device for receiving charging current from a battery charger through a connector having a D+ pin for connection to the battery charger and connected to the amplifier output terminal for battery charger detection. The portable device can meet the USB battery charger specification rev. 1.2.

19 Claims, 4 Drawing Sheets

SELF-ADAPTING VOLTAGE AMPLIFIER AND BATTERY CHARGER DETECTION

BACKGROUND OF THE INVENTION

The present invention relates generally to battery charging circuitry and, more particularly, to a self-adapting voltage amplifier and battery charger detection.

Many portable devices today have battery charger circuitry that connects to a power source via a Universal Serial Bus (USB) connector. USB is an industry standard that defines the cables, connectors and communications protocols used by a bus for connection, data communication and power supply between electronic devices and apparatus. A USB portable device includes a USB receptacle (female) connector and typically includes a battery. The USB receptacle has power supply pins for power supply, and data communication D+ and D− pins, and may also include an identification (ID) pin. A USB battery charger includes a USB plug (male) connector, and is capable of supplying battery charging current to a portable device through the power supply pins of the USB connector. The battery charger also may be capable of data exchange with the portable device through the D+ and D− pins of the USB connector.

The USB battery charging specification defines various kinds of upstream chargers that may be connected to a downstream portable device through a charging port to supply power to the portable device battery. A charging downstream port (CDP), on an upstream apparatus such as a computer, supports data transfers as well as power supply. A dedicated charging port (DCP) supplies power but does not support data transfer and may be a converter that converts power from a mains supply or from a vehicle's power supply to a USB charging power supply. An accessory charger adapter (ACA) is an adapter that allows a single USB port to be attached to both a charger and another USB device (for data transfer) at the same time. An ACA-dock is a docking station that has an upstream port and may or may not have downstream ports. A portable device can recognize the type of USB port from the way the D+ and D− pins are connected in the battery charger and the voltages on them.

The USB Battery Charging specification revision 1.1 specifies that, for mutual detection of the type of battery charger and the type of portable device connected together through the USB connector, the USB portable device should maintain a voltage $V_{DP\_SRC}$ 0.5-0.7V on the D+ pin during charger detection while sourcing at least 250 µA current. This is the only requirement during battery charger detection for the D+ voltage source of the portable device in the USB battery charging specification rev 1.1. A conventional voltage follower operational amplifier, often included in a portable device as a buffer amplifier, with its output connected to the D+ pin for data signal communications, can meet this requirement.

In order to support the detection of an ACA-Dock, the USB battery charging specification revision 1.2 also requires that the voltage source output of the portable device shall not pull the D+ pin below 2.2V through a 0.9-1.575 kΩ pull up resistance $R_{DP\_UP}$ that is connected to a voltage $V_{DP\_UP}$ between 3.0V and 3.6V in the battery charger. A conventional voltage follower cannot meet this requirement due to its negative feedback circuit. As the input of the buffer amplifier is always 0.6V, its output tries to pull the D+ pin down to 0.6V while the pull up resistor $R_{DP\_UP}$ in the battery charger is trying to pull the voltage of the D+ pin up. It would be desirable to have a portable device capable of meeting this requirement of the USB battery charging specification revision 1.2.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF THE INVENTION

The following description is given by way of example with reference to battery charger detection in a portable device. However, it will be appreciated that the amplifier illustrated has other applications and is not limited to battery charger detection.

The present invention provides an amplifier that adapts its output voltage as a function of external connection conditions at its output terminal. The amplifier can be used for battery charger detection in a portable device, but also has other applications.

Figure 1:
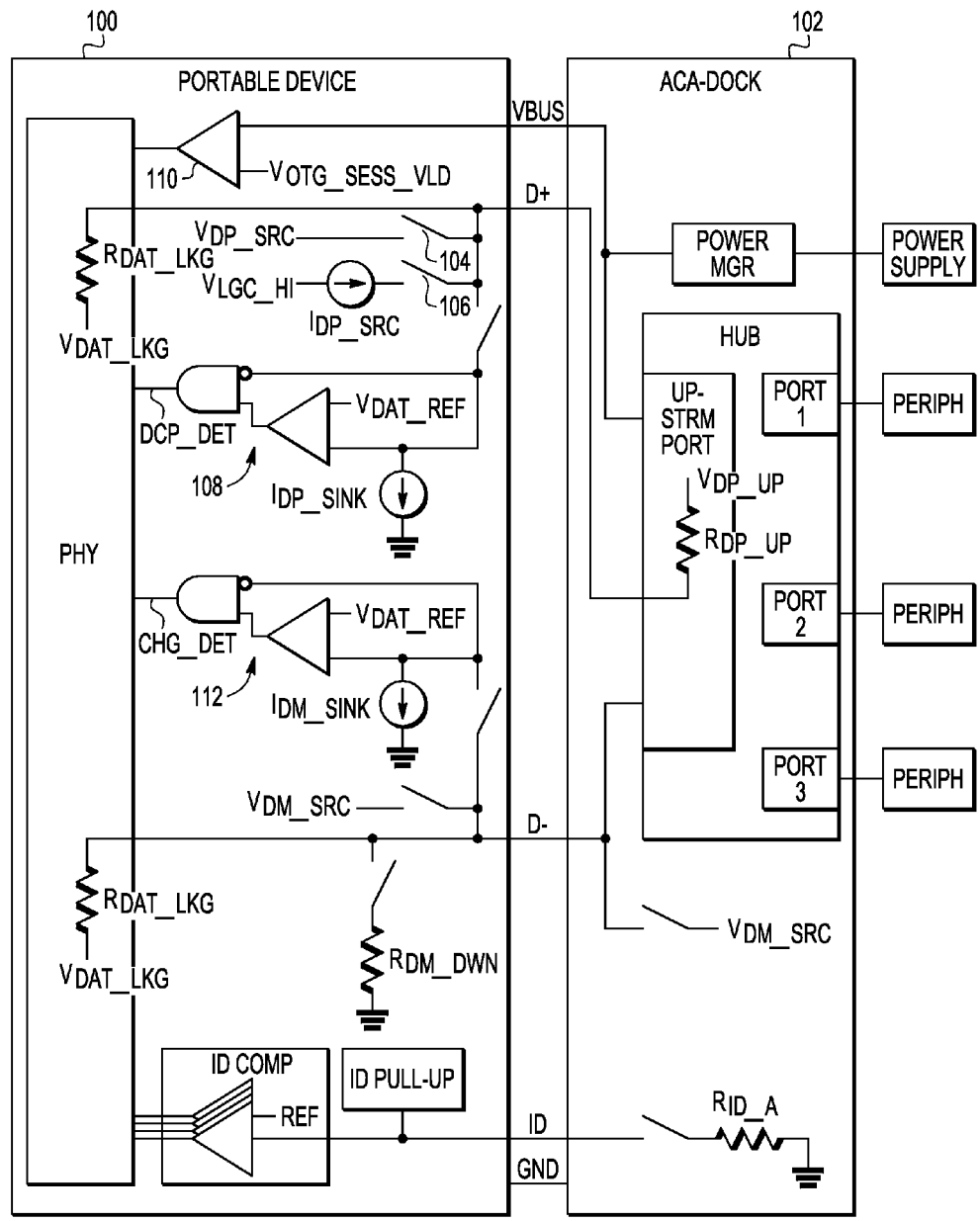
FIG. 1 is a schematic diagram of a portable device connected to a battery charger in accordance with the USB battery charger specification.

FIG. 1 shows a portable device 100 connected to a battery charger in accordance with the USB battery charger specification revision 1.2. The battery charger is contained in an accessory charger adapter ('ACA') dock 102 in the case illustrated in FIG. 1. The D+, D−, VBUS, ID and GND (ground) pins of the USB receptacle on the portable device 100 and the USB plug on the ACA-dock 102 are connected together and are shown schematically. The portable device 100 has a source of voltage $V_{DP\_SRC}$ that is connected to the D+ pin by a switch 104 during charger detection and a source of voltage $V_{LGC\_HI}$ that is connected to the D+ pin by a switch 106 during data pin contact detection to assert a logic signal. A description of the other elements shown in FIG. 1 is contained in the USB battery charging specification revision 1.2, which is incorporated herein.

Figure 2:
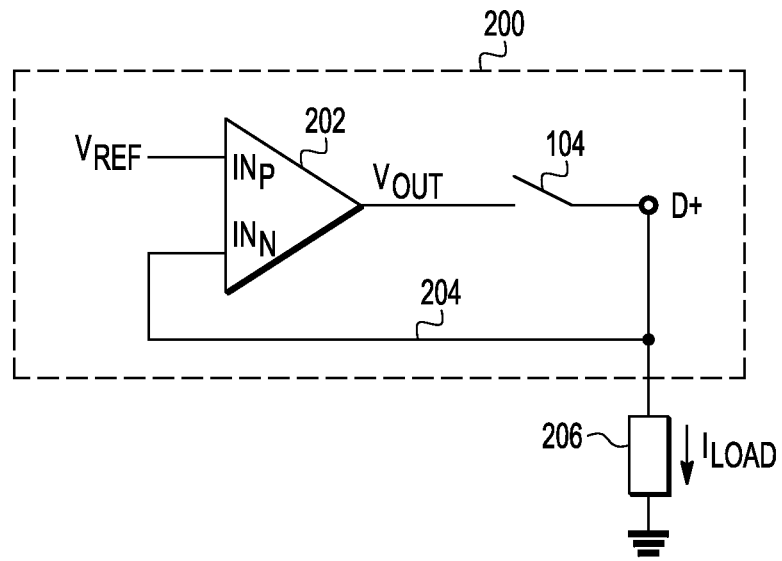
FIGS. 2 and 3 are schematic diagrams of a known portable device connected externally in different configurations.

FIG. 2 illustrates a conventional portable device 200, compliant with the USB battery charger specification revision 1.1, but not revision 1.2. The portable device 200 includes an operational amplifier 202 having a positive input $IN_P$ connected to a source of a reference voltage $V_{REF}$, an output applying a voltage $V_{OUT}$ to the switch 104 and an inverting input $IN_N$ connected in a negative feedback loop 204 to the D+ pin of a USB receptacle to receive the output voltage $V_{OUT}$. In the configuration shown in FIG. 2, the D+ pin is connected to ground through an external load 206. In compliance with the USB battery charger specification revision 1.1, in this configuration the output voltage $V_{OUT}$ maintains a voltage $V_{DP\_SRC}$ between 0.5V and 0.7V on the D+ pin when the switch 104 is closed during charger detection while sourcing a current $I_{LOAD}$ of at least 250 µA in the load 206.

Figure 3:
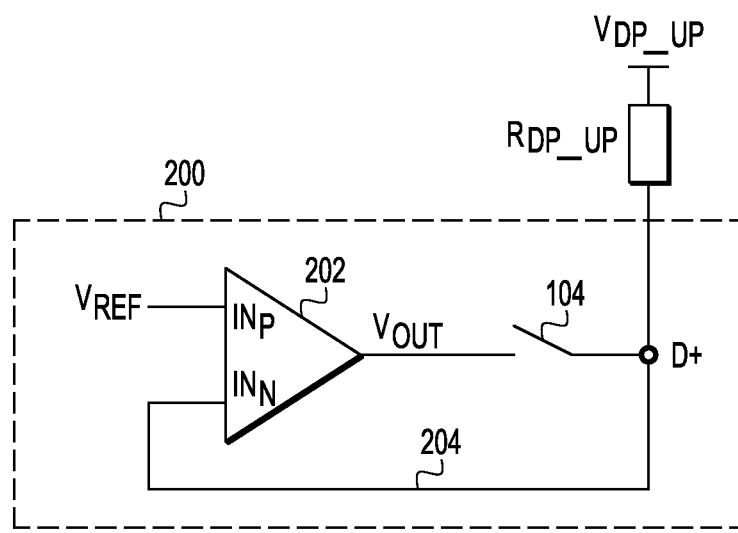

FIG. 3 illustrates the portable device 200 in a configuration in which the D+ pin is connected externally to a source of a voltage $V_{DP\_UP}$ between 3.0V and 3.6V through a pull-up resistance $R_{DP\_UP}$ between 0.9 kΩ and 1.575 kΩ, for example in an ACA-dock. To be compliant with the USB battery charger specification revision 1.2, in the configuration shown in FIG. 3, the portable device 200 should allow the voltage on the D+ pin to rise to or above 2.2V. However, in the conventional portable device 200, due to the negative feedback from the D+ pin to the negative input $IN_N$, the transconductance $g_m$ of the operational amplifier 202 pulls the voltage of the D+ pin down towards $V_{DP\_SRC}$ between 0.5V and 0.7V.

Figure 4:
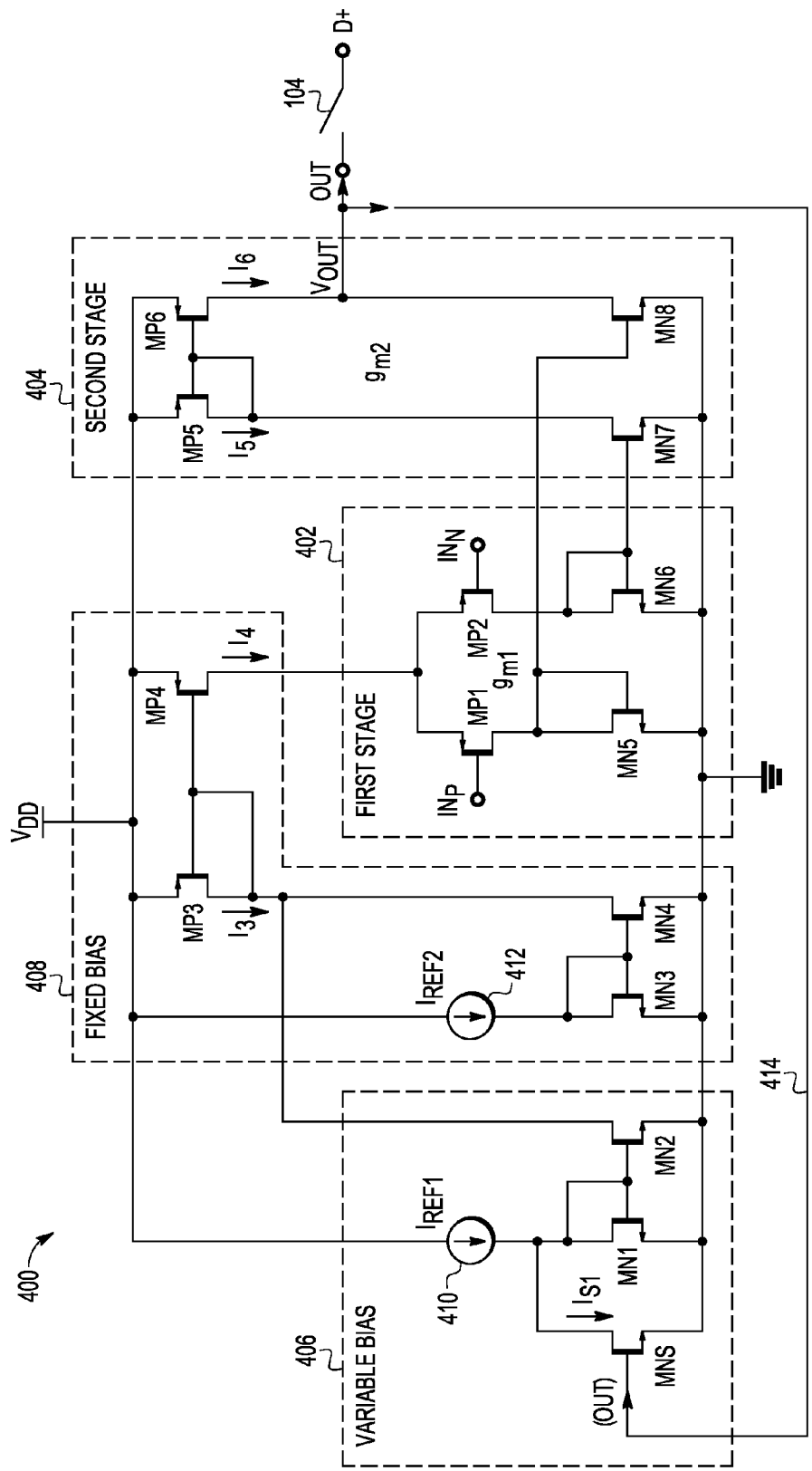
FIG. 4 is a diagram of an amplifier in a portable device in accordance with one embodiment of the invention, given by way of example.

FIG. 4 illustrates a portable device 400 for receiving charging current from a battery charger in accordance with an example of an embodiment of the invention. The portable device 400 comprises a connector having a D+ pin for connection to the battery charger. The portable device 400 also includes an amplifier having a first stage 402 and a second stage 404 for applying a voltage to the D+ pin during charger detection, and having a variable bias circuit 406 and a fixed bias circuit 408 that provide bias to the first and second stages 402 and 404 of the amplifier. The amplifier (including the first and second stages 402, 404) has a transconductance $g_m$ that is a function of the bias. The variable and fixed bias circuits 406, 408 provide a first level of bias ($I_{REF2}+I_{REF1}$) in the absence of a pull-up resistor $R_{DP\_UP}$ in the battery charger connected to the D+ pin causing the amplifier to function at a first transconductance $g_m$ and apply a first voltage $V_{DP\_SRC}$ to the D+ pin. The bias circuits 406 and 408 provide a second level of bias $I_{REF2}+I_{REF1}-I_{S1}$) in the presence of the pull-up resistor $R_{DP\_UP}$ causing the amplifier to function at a second reduced transconductance $g_m$ and to enable the D+ pin to adopt a second voltage higher than the first voltage $V_{DP\_SRC}$.

In one example, the first and second stages 402, 404 of the amplifier have an input $IN_P$ connected to a source of a reference voltage $V_{REF}$ and a negative feedback loop connecting the D+ pin with an inverting input $IN_N$ of the first stage 402 of the amplifier.

In one example, the first and second bias circuits 406 and 408 supply respectively first and second bias currents ($I_{REF1}-I_{S1}$) and $I_{REF2}$ in parallel to the amplifier, the first bias current ($I_{REF1}-I_{S1}$) being greater in the absence of the pull-up resistor $R_{DP\_UP}$ than in the presence of the pull-up resistor. The first bias circuit 406 includes a first current source 410 for supplying a reference bias current $I_{REF1}$ through a first current mirror MN1, MN2 and a shunt MNS having a control electrode connected with the D+ pin for shunting at least a part $I_{S1}$ of the reference bias current $I_{REF1}$ away from the current mirror in the presence of the pull-up resistor.

In the example shown in the drawings, the first voltage $V_{DP\_SRC}$ is between 0.5V and 0.7V when sourcing a current of at least 250 μA and the second voltage is between 2.2V and 3.6V when the D+ pin is connected to a voltage between 3.0V and 3.6V through a pull up resistance between 0.9 kΩ and 1.575 kΩ in the battery charger.

The portable device 400 shown in the drawings has a USB receptacle including the D+ pin and is compliant with the USB battery charger specification revision 1.2. However, other examples of the portable device 400 may be suitable for use with other battery chargers, which are not compliant with the USB battery charger specification revision 1.2.

In FIG. 4, the amplifier (including the first and second stages 402, 404, applies an output voltage $V_{OUT}$ to an output terminal OUT. The first and second bias circuits 406 and 408 provide first and second bias currents $I_{REF1}$ and $I_{REF2}$ in parallel to the amplifier. The variable bias circuit 406 includes a shunt MNS having a control electrode connected with the output terminal OUT for shunting at least a part of the first bias current $I_{REF1}$ away from the first bias circuit 406 in a first external connection condition at the output terminal OUT. The amplifier applies to the output terminal OUT a different level of the output voltage $V_{OUT}$ in the first external connection condition than in a second external connection condition at the output terminal.

In one example, the first stage 402 of the amplifier includes a non-inverting input $IN_P$ connected to a source of a reference voltage $V_{REF}$, and an inverting input $IN_N$. There also is a negative feedback loop connecting the output terminal OUT with the inverting input $IN_N$. The shunt MNS may provide a positive feedback loop from the output terminal OUT to the first stage 402 through the first bias circuit 406. The positive feedback loop may weaken the negative feedback of the negative feedback loop when the external pull-up resistor is connected between the output terminal and the external voltage source.

The first and second bias circuits 406 and 408 may comprise first and second current mirrors MN1, MN2 and MN3, MN4 and first and second reference current sources 410 and 412 respectively, each of the current mirrors having a reference current branch receiving reference current $I_{REF1}$ or $I_{REF2}$ from the respective reference current source and a current mirror branch, and the shunt MNS being connected to shunt current from the first reference current source 410 away from the reference current branch of the first current mirror. The shunt MNS may include a field-effect transistor (FET) having the control electrode, and a source-drain current flow path connected in parallel with the reference current branch of the first current mirror MN1, MN2.

In this example of the amplifier, the first external connection condition corresponds to the presence of an external pull-up resistor $R_{DP\_UP}$ connected between the output terminal OUT and an external voltage source $V_{DP\_UP}$. The second external connection condition corresponds to the absence of the pull-up resistor $R_{DP\_UP}$ and a load 206 connected to the output terminal OUT. In this example of the amplifier, the level of the output voltage $V_{OUT}$ is greater in the first external connection condition when the shunt MNS shunts the part of the first bias current $I_{REF1}$ away from the first bias module 406 than in the second external connection condition.

In more detail, the portable device 400 has a USB receptacle including D−, VBUS, ID and GND pins in addition to the D+ pin, as illustrated in FIG. 1, an amplifier and a switch 104 for connecting the output OUT of the amplifier to the D+ pin. Charger detector elements in the portable device 400 include elements shown in FIG. 1, such as a comparator 108 for comparing the voltage on the D+ pin with a reference voltage $V_{LGC\_HP}$, a comparator 110 for comparing the voltage on the VBUS pin with a reference voltage $V_{OTG\_SESS\_VLD}$ of 4.0V and a comparator 112 for comparing the voltage on the D− pin with reference voltages $V_{DAT\_REF}$ of 0.4V and $V_{LGC}$ of 0.8V in accordance with the USB battery charger specification revision 1.2.

The amplifier of the portable device 400 has a first stage 402 and a second stage 404. The first stage 402 has an input $IN_P$ connected to a source (not shown) of a reference voltage $V_{REF}$ and an inverting input $IN_N$. A negative feedback loop (like the feedback loop 204 of FIGS. 2 and 3, but not shown in FIG. 4) connects the D+ pin with an inverting input $IN_N$ of the first stage 402. The first stage 402 includes a differential pair of p-type metal-oxide semiconductor field-effect transistors ('MOSFETs') MP1 and MP2 whose gates are connected to the inputs $IN_P$ and $IN_N$ respectively and form differential voltage follower circuits.

The fixed bias circuit 408 includes a p-type MOSFET MP4 whose source is connected to a power supply $V_{DD}$ and whose drain is connected to the sources of the MOSFETs MP1 and MP2 to supply to the pair a bias current $I_4$. The drains of the MOSFETs MP1 and MP2 of the first stage 402 are connected to the drains of a pair of n-type MOSFETs MN5 and MN6 whose sources are connected to ground and which form a symmetric active load of the voltage follower circuits of the first stage 402. The MOSFET MN5 is connected to the second stage 404 in current mirror configuration with an n-type MOSFET MN8 whose source is connected to ground and whose drain is connected to the output terminal OUT of the amplifier 402,404. The MOSFET MN6 is connected to the second stage 404 in current mirror configuration with an n-type MOSFET MN7 whose source is connected to ground and whose drain is connected to an inverter including p-type MOSFETs MP5 and MP6. The sources of the MOSFETs MP5 and MP6 are connected to the power supply $V_{DD}$. The drain of the MOSFET MP5 is connected to the drain of the MOSFET MN7 and the MOSFETs MP5 and MP6 are connected together in current mirror configuration, with the drain of the MOSFET MP6 connected to the output terminal OUT of the amplifier.

The bias MOSFET MP4 of the fixed bias circuit 408 is connected in current mirror configuration with a p-type MOSFET MP3 whose source is connected to the power supply $V_{DD}$ and whose drain is connected to the drain of an n-type MOSFET MN4, whose source is connected to ground and which is connected in current mirror configuration with an n-type MOSFET MN3. The MOSFET MN3 receives a constant bias current $I_{REF2}$ from a second current source 412.

The drain of the MOSFET MP3 is also connected to the variable bias circuit 406, which includes an n-type MOSFET MN2, whose source is connected to ground and whose drain is connected to the drain of the MOSFET MP3, and which is connected in current mirror configuration with an n-type MOSFET MN1. The source of the MOSFET MN1 is connected to ground and its drain is connected to the current source 410, which provides a constant bias current $I_{REF1}$. The variable bias circuit 406 also includes an n-type MOSFET MNS whose source and drain are connected in parallel with the source-drain path of the MOSFET MN1 between the first current source 410 and ground, the gate of the MOSFET MNS being connected with the output OUT of the amplifier through a connection 414.

The sizes (channel width and length) of the MOSFETs of each pair preferably are equal so that the current gains of the current mirrors are one (1). Accordingly, the sizes of MN1 and MN2 are equal, the sizes of MN3 and MN4 are equal, the sizes of MN5, MN6, MN7 and MN8 are equal, the sizes of MP1 and MP2 are equal, the sizes of MP3 and MP4 are equal, and the sizes of MP5 and MP6 are equal. It will be appreciated that it is possible to use MOSFETs of different sizes if a current gain different from one (1) is desired.

In operation, all the MOSFETs MN1 to MN8 and MP1 to MP6 are in saturation. The bias currents of the first stage 402 are given by:

$$I_4 = I_3 = I_{REF2} + I_{REF1} - I_{S1}$$

where $I_3$ and $I_4$ are the source-drain currents of the MOSFETs MP3 and MP4, $I_{REF2}$ and $I_{REF1}$ are the bias currents from the current sources 412 and 410, and $I_{S1}$ is the drain-source current of the MOSFET MNS. The transconductance $g_{m1}$ of the first stage 402 is given by:

$$g_{m1} \propto \sqrt{0.5 \cdot I_4}$$

The bias currents of the second stage 404 are given by:

$$I_5 = I_6 = I_4/2$$

where $I_5$ and $I_6$ are the source-drain currents of the MOSFETs MP5 and MP6. The transconductance $g_{m2}$ of the second stage 404 is given by:

$$g_{m2} \propto \sqrt{I_4/2}$$

The overall loop gain of the amplifier is given by:

$$g_m \propto g_{m1} \cdot g_{m2} \propto I_4$$

and therefore is proportional to $(I_{REF2} + I_{REF1} - I_{S1})$.

When the portable device 400 is in a configuration similar to that of the portable device 200 as shown in FIG. 2, where there is no pull-up resistance such as $R_{DP\_UP}$ connected to the D+ pin and the output terminal OUT of the amplifier, the gate voltage of the shunt MOSFET MNS is between 0.5V and 0.7V and the drain-source current $I_{S1}$ of the MOSFET MNS is small. The MOSFET MNS shunts very little of the bias current $I_{REF1}$ of the first current source 410 away from the MOSFET MN1. The amplifier is biased by the variable and fixed bias circuits 406 and 408 normally with the full bias currents $I_{REF2}$ and $I_{REF1}$ and the transconductance and voltage gain of the amplifier are maximal.

When the portable device 400 is in a configuration similar to that of the portable device 200 as shown in FIG. 3, where a pull-up resistance such as $R_{DP\_UP}$ is connected to the D+ pin and the output terminal OUT of the amplifier the gate voltage of the shunt MOSFET MNS is pulled up higher. As a result, the drain-source current $I_{S1}$ of the MOSFET MNS increases and starts to shunt bias current $I_{REF1}$ of the first current source 410 away from the MOSFET MN1. The transconductance and the open loop voltage gain of the amplifier reduce and the voltage at the output terminal OUT of the amplifier can increase further since the negative feedback of the amplifier decreases. The MOSFET MNS then shunts more and more bias current $I_{REF1}$ of the first current source 410 away from the MOSFET MN1 until the pull-up resistance such as $R_{DP\_UP}$ overcomes the negative feedback of the amplifier.

When the portable device 400 is in a configuration similar to that of the portable device 200 as shown in FIG. 2, with no pull-up resistance such as $R_{DP\_UP}$ connected to the output terminal OUT of the amplifier, temporary disturbances, such as interference, can cause voltage glitches at the output terminal OUT. These will appear at the gate of the shunt MOSFET MNS, pulling its voltage up higher. The MOSFET MNS shunts more and more bias current $I_{REF1}$ of the first current source 410 away from the MOSFET MN1 and the negative feedback of the amplifier will temporarily be reduced. However, as soon as the glitch disappears, the negative feedback assured by the constant bias current $I_{REF1}$ of the variable bias circuit 408 resumes, ensures that the operational amplifier remains stable and its transconductance and voltage gain return to the normal levels.

Another feature of the amplifier shown in FIG. 4 is that the shunt n-type device MNS coupled between the output terminal OUT and the first current source $I_{REF1}$ protects against an amplifier output overload condition. The shunt device MNS connection creates a positive feedback loop from the output terminal OUT to the input stage 402 through the variable bias circuits 406. By design, the positive feedback loop through the shunt n-type device MNS will not be activated when the amplifier operates in a normal operating condition with a normal output voltage and current range, for example 0.5V to 0.7V and 0 µA to 250 µA. The positive feedback loop will only be activated when the amplifier operates at an abnormally higher output voltage and/or abnormally high sink current going through the n-type device MN8. The result of the positive feedback is then to reduce the transconductance of the amplifier, thus weakening the negative feedback from the D+ pin to the negative input $IN_N$. This prevents a large output sinking current overload contention with the amplifier and allows the output voltage to stabilize in a safe range, for example above 2.2V but below the external supply voltage applied to the output terminal OUT.

Figures 5, 6:
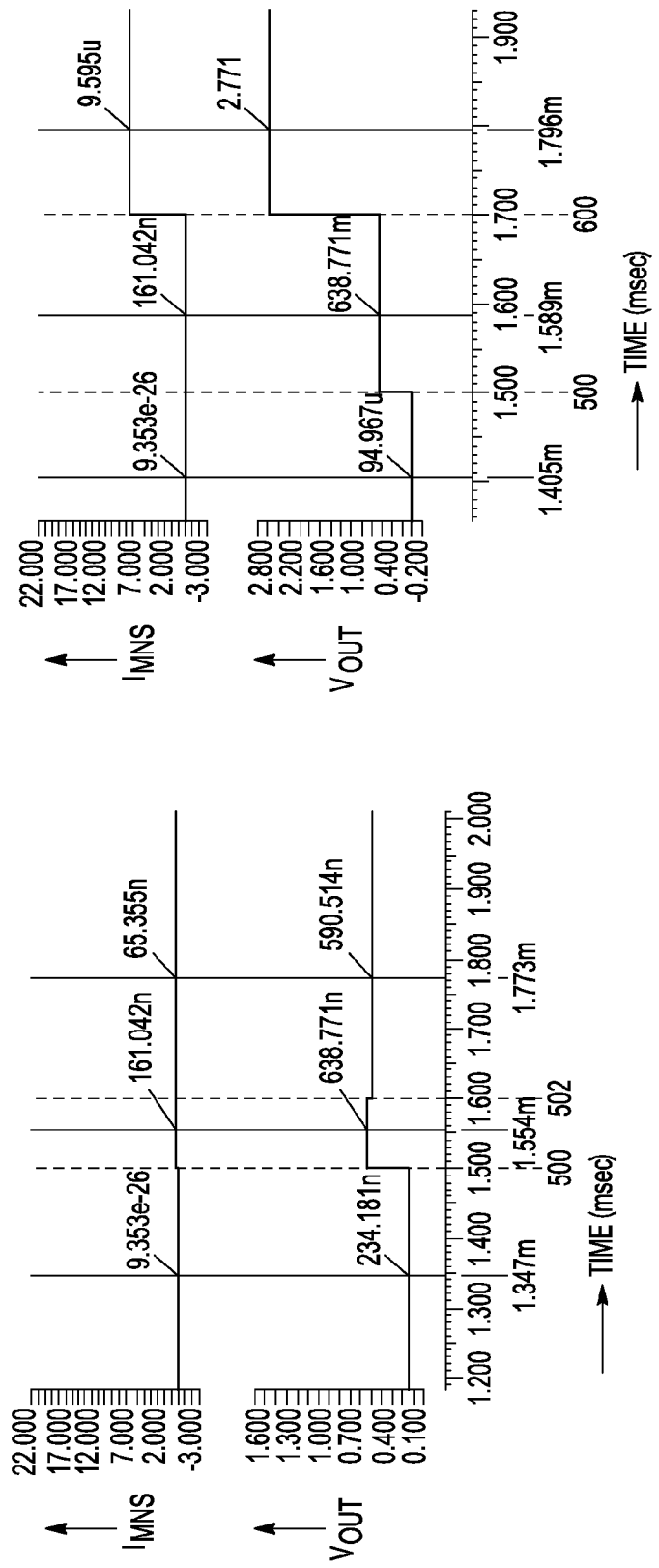
FIGS. 5 and 6 show waveforms of currents and voltages appearing in operation of the amplifier of FIG. 4.

FIGS. 5 and 6 illustrate waveforms of the drain-source current $I_{S1}$ of the MOSFET MNS shunting the MOSFET MN1 and the output voltage $V_{OUT}$ at the output terminal OUT obtained during operation of an example of a portable device 400 in different circumstances. As shown in FIG. 5, until the time 500 the current $I_{S1}$ is small and at the limits of measurement and the output voltage $V_{OUT}$ is at 0.2V. At the time 500, a voltage of 0.64V is applied to the terminal INP. The current $I_{S1}$ remains very low at 160 nA and the output voltage $V_{OUT}$ rises to 0.637V. At the time 502, a load carrying a current of 250 µA is connected between the output terminal OUT and ground. The current $I_{S1}$ does not vary significantly and the output voltage $V_{OUT}$ reduces to 0.590V, which is still within the required range of the battery charging specification.

As shown in FIG. 6, until the time 500 the current $I_{S1}$ is again small and at the limits of measurement, and in this example the output voltage $V_{OUT}$ is at 0.1V. At the time 500, a voltage of 0.64V is applied to the terminal INP. The current $I_{S1}$ remains very low at 160 nA and the output voltage $V_{OUT}$ rises to 0.639V. At the time 600, a pull up resistance between 0.9 kΩ and 1.575 kΩ is connected between the output terminal OUT and a voltage between 3.0V and 3.6V. The current $I_{S1}$ increases to more than 9 µA and the output voltage $V_{OUT}$ rises to more than 2.7V, which is compliant with the battery charging specification revision 1.2.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated OUT into various different connections carrying subsets of these signals. Therefore, many options exist for transferring signals.

Although specific conductivity types or polarity of potentials have been described in the examples, it will appreciated that conductivity types and polarities of potentials may be reversed. That is, the signals described herein may be designed as positive (high active) or negative logic (low active). Similarly, the terms "assert" or "set" and "negate" (or "de-assert" or "clear") when referring to the rendering of a signal, status bit, or similar apparatus into its logically true or logically false state, respectively. If the logically true state is a logic one, the logically false state is a logic zero, and if the logically true state is a logic zero, then the logically false state is a logic one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A portable device for receiving charging current from a battery charger, the portable device comprising:
   a connector having a D+ pin for connection to said battery charger; and
   an amplifier for applying a voltage to said D+ pin during charger detection, and having a bias circuit for providing bias to said amplifier,
   wherein said amplifier has a transconductance that is a function of said bias, and
   wherein said bias circuit provides a first level of bias in the absence of a pull-up resistor in said battery charger connected to said D+ pin causing said amplifier to function at a first transconductance and apply a first voltage to said D+ pin, and said bias circuit provides a second level of bias in the presence of said pull-up resistor causing said amplifier to function at a second reduced transconductance and to enable said D+ pin to adopt a second voltage higher than said first voltage.

2. The portable device of claim 1, wherein said amplifier has a non-inverting input connected to a source of a reference voltage, an inverting input, and a negative feedback loop connecting said D+ pin with said inverting input.

3. The portable device of claim 1, wherein said bias circuit includes first and second bias modules for supplying respectively first and second bias currents in parallel to said amplifier, said first bias current being greater in the absence of said pull-up resistor than in the presence of said pull-up resistor.

4. The portable device of claim 3, wherein said first module includes a first current source for supplying a reference bias current through a first current mirror and a shunt having a control electrode connected with said D+ pin for shunting at least a part of said first bias current away from said current mirror in the presence of said pull-up resistor.

5. The portable device of claim 1, wherein said first voltage is between 0.5V and 0.7V when sourcing a current of at least 250 μA and said second voltage is between 2.0V and 3.6V when said D+ pin is connected to a voltage between 3.0V and 3.6V through a pull up resistance between 0.9 kΩ and 1.575 kΩ in the battery charger.

6. A portable device for receiving charging current from a universal serial bus (USB) battery charger, said device comprising:
   a universal serial bus (USB) receptacle having a D+ pin for connection to said battery charger; and
   an amplifier for applying a voltage to said D+ pin during charger detection, and having a bias circuit for providing bias to said amplifier,
   wherein said amplifier has a transconductance that is a function of said bias, and
   wherein said bias circuit provides a first level of bias in the absence of a pull-up resistor in said battery charger connected to said D+ pin causing said amplifier to function at a first transconductance and apply a first voltage to said D+ pin, and said bias circuit provides a second level of bias in the presence of said pull-up resistor causing said amplifier to function at a second reduced transconductance and to enable said D+ pin to adopt a second voltage higher than said first voltage.

7. The portable device of claim 6, wherein said amplifier has an input connected to a source of a reference voltage and a negative feedback loop connecting said D+ pin with an inverting input of said amplifier.

8. The portable device of claim 6, wherein said bias circuit includes first and second bias modules for supplying respectively first and second bias currents in parallel to said amplifier, said first bias current being greater in the absence of said pull-up resistor than in the presence of said pull-up resistor.

9. The portable device of claim 8, wherein said first module includes a first current source for supplying a reference bias current through a first current mirror and a shunt having a control electrode connected with said D+ pin for shunting at least a part of said first bias current away from said current mirror in the presence of said pull-up resistor.

10. The portable device of claim 6, wherein said portable device is compliant with the USB battery charging specification revision 1.2.

11. The portable device of claim 6, wherein said first voltage is between 0.5V and 0.7V when sourcing a current of at least 250 μA and said second voltage is between 2.0V and 3.6V when said D+ pin is connected to a voltage between 3.0V and 3.6V through a pull up resistance between 0.9 kΩ and 1.575 kΩ in the battery charger.

12. An amplifier for applying an output voltage to an output terminal, the amplifier comprising:
   first and second bias modules for providing first and second bias currents in parallel to the amplifier; and
   a shunt having a control electrode connected with the output terminal for shunting at least a part of the first bias current away from the first bias module in a first external connection condition at the output terminal,
   wherein the amplifier applies to the output terminal a different level of said output voltage in the first external connection condition than in a second external connection condition at the output terminal.

13. The amplifier of claim 12, further comprising a non-inverting input connected to a source of a reference voltage, an inverting input, and a negative feedback loop that connects the output terminal with the inverting input.

14. The amplifier of claim 13, wherein the amplifier includes first and subsequent amplifier stages, and the shunt provides a positive feedback loop from the output terminal to the first amplifier stage through the first bias module, and wherein the positive feedback loop weakens the negative feedback of the negative feedback loop when the external pull-up resistor is connected between the output terminal and the external voltage source.

15. The amplifier of claim 12, wherein the first and second bias modules comprise first and second current mirrors and first and second reference current sources respectively, each of the current mirrors having a reference current branch receiving reference current from the respective reference current source and a current mirror branch, and the shunt being connected to shunt current from the first reference current source away from the reference current branch of the first current mirror.

16. The amplifier of claim 15, wherein the shunt includes a field-effect transistor (FET) having the control electrode, and a source-drain current flow path connected in parallel with the reference current branch of the first current mirror.

17. The amplifier of claim 16, wherein the amplifier includes first and subsequent amplifier stages, and the shunt provides a positive feedback loop from the output terminal to the first amplifier stage amplifier through the first bias module.

18. The amplifier of claim 12, wherein the first external connection condition corresponds to the presence of an external pull-up resistor connected between the output terminal and an external voltage source, and the second external connection condition corresponds to the absence of the pull-up resistor and a load connected to the output terminal.

19. The amplifier of claim 12, wherein the level of the output voltage is greater in the first external connection condition when the shunt shunts the part of the first bias current away from the first bias module than in the second external connection condition.

* * * * *